United States Patent
Nowosad (10) Patent No.: US 11,374,548 B2
(45) Date of Patent: Jun. 28, 2022

(54) FILTER CIRCUIT FOR REDUCING FEEDBACK OF A CONSUMER ON AN ENERGY SUPPLY

(71) Applicant: ZIEHL-ABEGG SE, Künzelsau (DE)

(72) Inventor: Dirk Nowosad, Neunkirchen (DE)

(73) Assignee: ZIEHL-ABEGG SE, Kunzelsau (DE)

( * ) Notice: Subject to any disclaimer, the term of this patent is extended or adjusted under 35 U.S.C. 154(b) by 168 days.

(21) Appl. No.: 16/856,661

(22) Filed: Apr. 23, 2020

(65) Prior Publication Data

US 2020/0343872 A1   Oct. 29, 2020

(30) Foreign Application Priority Data

Apr. 25, 2019 (DE) .......................... 102019205946.5

(51) Int. Cl.
| | | |
|---|---|---|
| *H03H 1/00* | (2006.01) | |
| *H03H 7/42* | (2006.01) | |
| *H02J 3/01* | (2006.01) | |
| *H02M 1/12* | (2006.01) | |

(52) U.S. Cl.
CPC ............. *H03H 1/0007* (2013.01); *H02J 3/01* (2013.01); *H03H 7/427* (2013.01); *H02M 1/123* (2021.05)

(58) Field of Classification Search
CPC .............................. H03H 1/0007; H03H 7/427
USPC ......................................... 333/177, 181, 185
See application file for complete search history.

(56) References Cited

U.S. PATENT DOCUMENTS

| | | |
|---|---|---|
| 4,967,334 A | 10/1990 | Cook et al. |
| 5,805,032 A | 9/1998 | Herbst et al. |
| 2007/0296374 A1 | 12/2007 | Baudesson et al. |
| 2015/0381136 A1 | 12/2015 | Oswald |

*Primary Examiner* — Rakesh B Patel
(74) *Attorney, Agent, or Firm* — Jason P. Mueller; FisherBroyles, LLP (57) ABSTRACT

A filter circuit for reducing feedback of a consumer on an energy supply is disclosed. This filter circuit includes a multipolar input, a line choke, and a multipolar output, wherein the input is configured to receive an AC voltage from the energy supply, wherein the output is configured to be connected to the consumer, wherein the line choke includes one coil for each pole of the input, and wherein the coils of the line choke are each connected between one pole of the input and one pole of the output and energy is transferred from the input to the output and/or vice versa. A resonant current suppression (RCS) group is connected in parallel to a coil of the line choke to transmit resonant currents arising at the line choke such that voltage increases generated by the resonant currents are reduced or suppressed by the at least one RCS circuit.

17 Claims, 5 Drawing Sheets

FILTER CIRCUIT FOR REDUCING FEEDBACK OF A CONSUMER ON AN ENERGY SUPPLY

CROSS REFERENCE TO RELATED APPLICATIONS

This application claims priority to German Patent Application No. 10 2019 205 946.5, filed Apr. 25, 2019, the entire contents of which is incorporated herein by reference.

BRIEF DESCRIPTION OF THE DRAWINGS

The accompanying drawings are part of the disclosure and are incorporated into the present specification. The drawings illustrate examples of embodiments of the disclosure and, in conjunction with the description and claims, serve to explain, at least in part, various principles, features, or aspects of the disclosure. Certain embodiments of the disclosure are described more fully below with reference to the accompanying drawings. However, various aspects of the disclosure may be implemented in many different forms and should not be construed as being limited to the implementations set forth herein. Like numbers refer to like, but not necessarily the same or identical, elements throughout.

DETAILED DESCRIPTION

This disclosure relates to a filter circuit element for reducing feedback of a consumer on an energy supply, comprising a multipolar input, a line choke, and a multipolar output, wherein the input is configured for inputting an AC voltage from the energy supply, wherein the output is configured to be connected to the consumer, wherein the line choke includes one coil for each pole of the input, and wherein the coils of the line choke are each connected between one pole of the input and one pole of the output and energy is transferred from the input to the output and/or vice versa. Furthermore, the disclosure relates to a corresponding system.

Practically every consumer which is supplied with energy by an energy supply, for example, a single-phase or multiphase energy supply network, generates feedback on the energy supply. In the case of energy supplies which output a substantially sinusoidal voltage to a consumer, many nonlinear components, for example, rectifiers, generate harmonics of different orders and forms. These harmonics occur at multiples of the frequency of the sinusoidal voltage of the energy supply. Moreover, some consumers generate high-frequency interference, for example, at several kilohertz, which cause feedback in the direction of the energy supply. These interferences can arise, for example, in switching power supplies or in inverters.

Since such feedback can have negative effects on other devices connected to the power supply, it is required in relevant norms (for example, EN 61000-3-2, EN 61000-3-12, IEEE 518) that harmonics have to remain below a defined level, frequently at less than 5% THDi (Total Harmonic Distortion). THDi refers to harmonic distortion of the current and is defined by $$THDi = \frac{\sqrt{I^2 - I_1^2}}{I_1^2}$$

In this case, $I_1$ is the effective value of the first harmonic (with frequency of the AC voltage, for example, 50 Hz or 60 Hz) and I is the effective value of the current as a whole (i.e., including all harmonics). To be able to meet these requirements, a filter circuit element is often connected between energy supply and consumer.

A filter circuit element which damps harmonics in AC voltage lines is known from U.S. Pat. No. 5,805,032 A. For this purpose, three passive filter circuit elements are provided, which each damp harmonics of various orders. This circuit has the disadvantage that high-frequency interferences of the consumer can only be filtered out to a limited extent.

In practice, line chokes are usually used to reduce high-frequency interferences. In this case, one coil is provided for each conductor of the energy supply, wherein the coils are typically magnetically coupled to one another. The line choke transmits the network frequency substantially unchanged and significantly damps high-frequency interference. Various circuits having line chokes are disclosed, for example, in US 2015/0381136 A1.

The use of line chokes has the disadvantage that resonant currents or changes of the consumer current curves can arise at these line chokes, which in turn cause a voltage drop at the line choke. These voltages can result in overvoltages at the output of the line choke, which can have an effect on a consumer connected downstream. In the best case, an overvoltage power-off of the consumer engages upon reaching a critical overvoltage and powers off the consumer, so that damage to the consumer is prevented. However, such power-offs are always unfavorable, since the consumer then fails until a restart. This can in turn result in consequential damages if the consumer is formed, for example, by a fan in a cooling system. Moreover, the overvoltages can increase rapidly at the output of the line choke in such a way that the overvoltage power-off can no longer react and the consumer can be damaged.

These problems may be pronounced if the consumer includes an inverter having intermediate circuit and if this intermediate circuit is configured as a slender intermediate circuit. In this case, a relatively small intermediate circuit capacitance is connected in the intermediate circuit, which smooths the rectified AC voltage. Current ripples thus remain in the intermediate circuit, which can cause resonance effects.

This disclosure is based on the object of designing and refining a filter circuit element and a system of the type mentioned at the outset in such a way that a reduction of feedback of a consumer on an energy supply is possible with reduced risk of overvoltages at the same time.

According to the disclosure, the above object is achieved by the features of claim 1. Accordingly, the filter circuit element in question is characterized in that a resonant current suppression group—RCS group—is arranged in parallel to a coil of the line choke, wherein the RCS group includes at least one resonant current suppression circuit—RCS circuit—wherein each RCS circuit includes a coil and a capacitor and has a bandpass characteristic, and wherein the bandpass characteristic is configured in each case to resonant currents arising on the line choke in such a way that voltage increases generated by the resonance circuits are reduced or suppressed by the at least one RCS circuit.

The above object is achieved with respect to a system by the features of claim 12. Accordingly, the system in question includes a filter circuit and a consumer, wherein the consumer is connected to the output of the filter circuit element and wherein the consumer can be supplied with energy from an energy supply connected to the input of the filter circuit element.

It has firstly been recognized that the advantages of a line choke in a filter circuit element do not necessarily have to be sacrificed if overvoltages are supposed to be avoided or reduced at an output of the filter circuit element. Rather, it is possible to reduce the overvoltages and/or the cause thereof directly at the line choke. For this purpose, according to the disclosure, a resonant current suppression group—referred to hereafter in abbreviated form as RCS group (resonant current suppression)—is connected in parallel to a coil of the line choke. This RCS group includes at least one resonant current suppression circuit—referred to hereafter in abbreviated form as RCS circuit—wherein each RCS circuit includes a coil and a capacitor and has a bandpass characteristic. Since the overvoltages at the line choke arise as a result of resonant currents, the bandpass characteristic of the at least one RCS circuit is configured to the resonant currents to be expected at the coil of the line choke connected in parallel in such a way that voltage increases generated by the resonant currents are reduced or suppressed by the at least one RCS circuit.

A bandpass characteristic characterizes a frequency-dependent filter and is defined by the center frequency $f_0$, the bandwidth B, and the amplitude response. At the center frequency $f_0$, an input signal is ideally transmitted without damping. The greater the distance of a frequency from the center frequency $f_0$ is, the greater is the damping of the input signal and/or the further the amplitude response decreases. The amplitude response indicates the dimension of this damping. The bandwidth B is determined by the frequencies above and below the center frequency $f_0$ at which the amplitude response has decreased to half (−3 dB). Due to the arrangement of an RCS circuit having a bandpass characteristic in parallel to a coil of the line choke, a path having good conductivity for voltages having frequencies around the center frequency of the RCS circuit results in parallel to the line choke. In this manner, the RCS circuit influences both the resonant currents generating the overvoltage and also the voltages induced by the resonant currents themselves. The overvoltage at the output of the filter circuit element can thus be effectively reduced by the RCS circuit/circuits. The more RCS circuits an RCS group includes, the more effectively the resonant currents and/or the overvoltages can be reduced and/or suppressed. Ideally, the resonant currents are reduced sufficiently strongly that they hardly come into consideration in comparison to the flowing current, for example, to less than 1% of the "useful current". Overall, in this manner a non-sinusoidal load current can again become approximately sinusoidal.

In a prototype circuit of the filter circuit element according to the disclosure, it has been shown that an overvoltage of greater than 100 V can be reduced to one-fifth or less of the original dimension, and in this case only currents in the order of magnitude of a few hundreds of milliamps flow through the RCS circuits. A low-loss auxiliary circuit has thus been provided using the filter circuit element according to the disclosure, which can simultaneously significantly reduce the feedback of a consumer on an energy supply or even completely suppress it. It is even possible in principle in this case to implement the individual elements of the RCS circuit partially in SMD (surface mounted device) construction. In this manner, the RCS circuits can be implemented in relatively compact structural form.

The energy supply, which inputs an AC voltage into the input of the filter circuit element to supply a consumer, can be implemented in greatly varying ways. An AC voltage, for example, a sinusoidal AC voltage, and can deliver sufficient energy for the supply of the consumer connected to the output of the filter circuit element. In this case, the energy supply may be formed by an energy supply network which delivers a low voltage, for example, at string voltages of 230 V or 120 V, to mention only two common voltages by way of example. In the case of a three-phase energy supply, voltages of 400 V or 210 V, respectively, thus result between the outer conductors. In this case, the AC voltage can have greatly varying frequencies, for example, 50 Hz or 60 Hz, to mention two of the most typical frequencies. The energy supply can deliver a rotary-phase current, i.e., three phases, the voltages of which are each shifted by 120° in relation to one another. However, the energy supply can also be formed by two individual phases or by one phase and a neutral conductor. The input of the filter circuit element and accordingly the output of the filter circuit element would also be configured depending on the design of the energy supply. This is because the input of the filter circuit element includes one pole per conductor of the energy supply which is to be connected to the filter circuit element. In this case, in most application scenarios, the number of the poles at the input of the filter circuit element has to be identical to the number of the poles at the output of the filter circuit element.

In principle, greatly varying consumers can be connected to the output of the filter circuit element. This is appropriate in this case if the consumer connected to the output of the filter circuit element also actually induces resonant currents in the line choke. However, this requirement is typically very simple to fulfill if the consumer contains capacitances and/or generates sufficiently pronounced harmonics, for example. It is furthermore advantageous for the dimensioning of the RCS circuits if the frequencies of the resonant currents to be expected are known, since the dimensioning can then take place in a more targeted manner. A certain adaptation between the filter circuit element and the consumer connected to the output is thus appropriate. This boundary condition is usually very simple to fulfill, however. If the resonant currents to be expected are not known, they can thus be estimated, for example, based on technical data of permitted consumers.

The RCS group/groups can also be constructed as desired in principle. As long as a bandpass characteristic of the RCS group is provided, the implementation thereof is substantially unimportant. In view of the typical field of use in the supply of consumers with AC voltages of greater than 110 V, however, it is appropriate if the RCS group/groups are each implemented by a passive filter.

In principle, it is sufficient to provide an RCS group only at the coil of the line choke at which resonant currents also actually result in overvoltages. However, since in practical usage scenarios resonant currents frequently will occur on all conductors of the energy supply, in one design, an RCS group having at least one RCS circuit in each case is arranged in parallel to each coil of the line choke.

In one design, the at least one RCS circuit is formed by a series circuit made of a coil and a capacitor, so that an LC resonant circuit results. In this manner, a bandpass results which is constructed very simply and thus only causes low costs. In one refinement of the RCS circuit, a resistor can be connected in parallel to the capacitor in this case. This resistor increases the bandwidth of the correspondingly formed RCS circuit.

In principle, the RCS group can include only one single RCS circuit. This can be sufficient if the resonant currents to be expected are very narrowband. For still further improvement of the effect of the filter circuit element, in one refinement the RCS group can also include multiple RCS circuits, wherein these multiple RCS circuits are connected in parallel to one another in this refinement. It is appropriate in this case if the bandpass characteristics of these multiple RCS circuits are not identical. Therefore, the RCS circuits may have bandpass characteristics each having different center frequencies and/or different bandwidths and/or different amplitude responses. In this manner, the filter circuit element can be configured to the resonant frequencies to be expected. The more RCS circuits are provided in an RCS group, the more effectively the circuit can act. In this case, however, it is to be considered that the improvements to be expected upon exceeding a certain number of parallel RCS circuits are no longer in proportion to the additional costs thus resulting. In many application scenarios, a number of at most three to five RCS circuits can therefore result within an RCS group. If multiple RCS groups are used, it is moreover appropriate if each of the RCS groups includes an identical number of RCS circuits. In this case, each RCS group can include identically constructed and/or identically dimensioned RCS circuits.

The use of the RCS group/groups already reduces—in addition to the overvoltages—harmonics and thus further feedback of the consumer on the energy supply. In one refinement and for further reduction of harmonics, the filter circuit element additionally includes at least one filter circuit group, which is connected in each case to two poles of the output. If a two-pole output is provided, the filter circuit group can be connected to these two poles of the output. If the output is embodied having three poles, the filter circuit group can thus be connected between two of the three poles of the output. It is also possible in this case that one filter circuit group is respectively arranged between each of the three poles, so that a total of three filter circuit groups would then be provided. This applies accordingly in the case of outputs having more than three poles. The at least one filter circuit group includes at least one filter circuit. This at least one filter circuit is configured in such a way that it dissipates harmonics (e.g., harmonic currents) between the individual poles of the output. These dissipated harmonics thus do not reach the line choke and thus also cannot promote or trigger resonance effects there or reach the energy supply. Even if the at least one filter circuit is dimensioned in such a way that harmonics are not completely dissipated, the at least one filter circuit can thus at least damp the harmonics. Otherwise occurring resonance effects and feedback on the energy supply can thus be reduced.

In one design, the at least one filter circuit has a bandpass characteristic, wherein the center frequency and/or the bandwidth of the bandpass characteristic are configured to the harmonics which are to be expected from the output of the filter circuit element due to the feedback of a connected consumer. The feedback of the consumer can also be known here or can be estimated by typical consumers, possibly defined in a datasheet of the filter circuit element. Due to such a bandpass characteristic, the at least one filter circuit does not influence the AC voltage of the energy supply or only influences it to a limited extent, but represents a connection between poles of the output having lower impedance for harmonics, to which the filter circuit is configured. These harmonics are thus at least partially dissipated and do not go further in the direction of the energy supply.

In principle, it is unimportant how the at least one filter circuit is constructed to induce this effect. In one embodiment, the at least one filter circuit includes a series circuit made of a coil and a capacitor in each case, however. This filter circuit, which is also known as an absorption circuit, is implementable cost-effectively and easily and nonetheless provides good filter results. In this case, the at least one filter circuit can be configured in such a way that the effects on the power factor cos $\varphi$ are as small as possible. This can be achieved in that the capacitor of the at least one filter circuit is selected to be relatively small. The capacitor of the at least one filter circuit may has a capacitance of less than 30 µF, a capacitance of less than 20 µF, or a capacitance of less than 10 µF. In this way, a good filter circuit can result, which nonetheless causes good harmonic suppression and an improvement of the cos $\varphi$.

In principle, the at least one filter circuit group can include only one single filter circuit. If the consumer generates few orders of harmonics, which are moreover close to one another (for example, fifth and seventh order), in this manner—jointly with the RCS group/groups—very effective harmonic reduction can nonetheless be achieved. In one refinement, however, multiple filter circuits, which are connected in parallel to one another, are provided in the at least one filter group. It is appropriate in this case if bandpass characteristics of these multiple filter circuits each have different center frequencies and/or different bandwidths. In this manner, the filter circuit group can be set according to various orders of harmonics. The effect of the filter circuit group with respect to the reduction of the harmonics also increases here with the number of the filter circuit elements within a filter circuit group. However—similarly as with the RCS circuits—there will be a maximum number, above which the achieved effect is no longer proportional to the additional costs for a further filter circuit. In many application scenarios, the number of filter circuits in a filter circuit group can be at most five filter circuits.

If multiple filter circuit groups are provided, an identical number of filter circuits may be provided in each of these filter circuit groups. Furthermore, it is appropriate if the individual filter circuits of a filter circuit group are formed and/or dimensioned identically to the filter circuits of the other filter circuit group/groups.

In one refinement, the filter circuit group can include a resistor which is connected in parallel to the at least one filter circuit. This resistor can be dimensioned in this case in the megaohm range, for example, between 1 MΩ and 10 MΩ. In this manner, the resistor practically has no effect in normal operation of the filter circuit element. However, if the filter circuit element is disconnected from the energy supply, this resistor in the filter group ensures that the filter circuits of the filter circuit group, for example, capacitors provided therein, are discharged.

In principle, the line choke can be formed from multiple coils constructed in a manner insulated from one another. Filtering of high-frequency feedback of the consumer could thus already be achieved. However, advantages result if the multiple coils of the line choke are magnetically coupled to one another. This can be achieved in that the coils are wound onto a common core. In practical designs, this core can be constructed in a line choke having three coils in the form of a closed W, wherein one coil of the line choke is respectively arranged on each leg.

The filter circuit element according to the disclosure can form a system according to the disclosure together with a consumer. In this case, the consumer is connected to the output of the filter circuit element. The consumer and the filter circuit element can be supplied from an energy supply connected to an input of the filter circuit element. In this system, the RCS group/groups or possibly the filter circuit group/groups can be set effectively to the respective resonant currents or respective harmonics, respectively, since these variables do not have to be merely estimated with a specific consumer. Rather, the behavior of the consumer can be determined relatively accurately together with the filter circuit element. In this manner, a system results in which overvoltages at the line choke and feedback in the energy supply can be reduced effectively. In this case, filter circuit element and consumer can be integrated jointly into a device. However, the filter circuit element can also be housed in a housing separate from the consumer, which is flanged onto the consumer, for example. The connection between filter circuit element and consumer can even be configured as detachable. In one embodiment, the filter circuit element is part of the consumer, however.

The consumer can be formed in principle in greatly varying ways. To be able to use the effect of the filter circuit element well, however, the consumer should induce harmonics and/or contribute to resonant currents in this case. In one design, the consumer includes a rectifier and/or other assemblies generating harmonics. In one design, the consumer includes an inverter. This inverter can be used to supply an electric motor, for example, an electronically commuted electric motor. The electric motor can be part of a fan. The inverter may having a slender intermediate circuit. The inverter can be arranged in an electronics housing of the electronic motor.

In principle, the consumer can have greatly varying power consumptions. Since the effects compensated here occur significantly more clearly at higher power consumptions, however, a consumer having moderate power consumption may be part of the system according to the disclosure, for example, having power consumptions in the order of magnitude of 3-7 kW.

Figure 1:
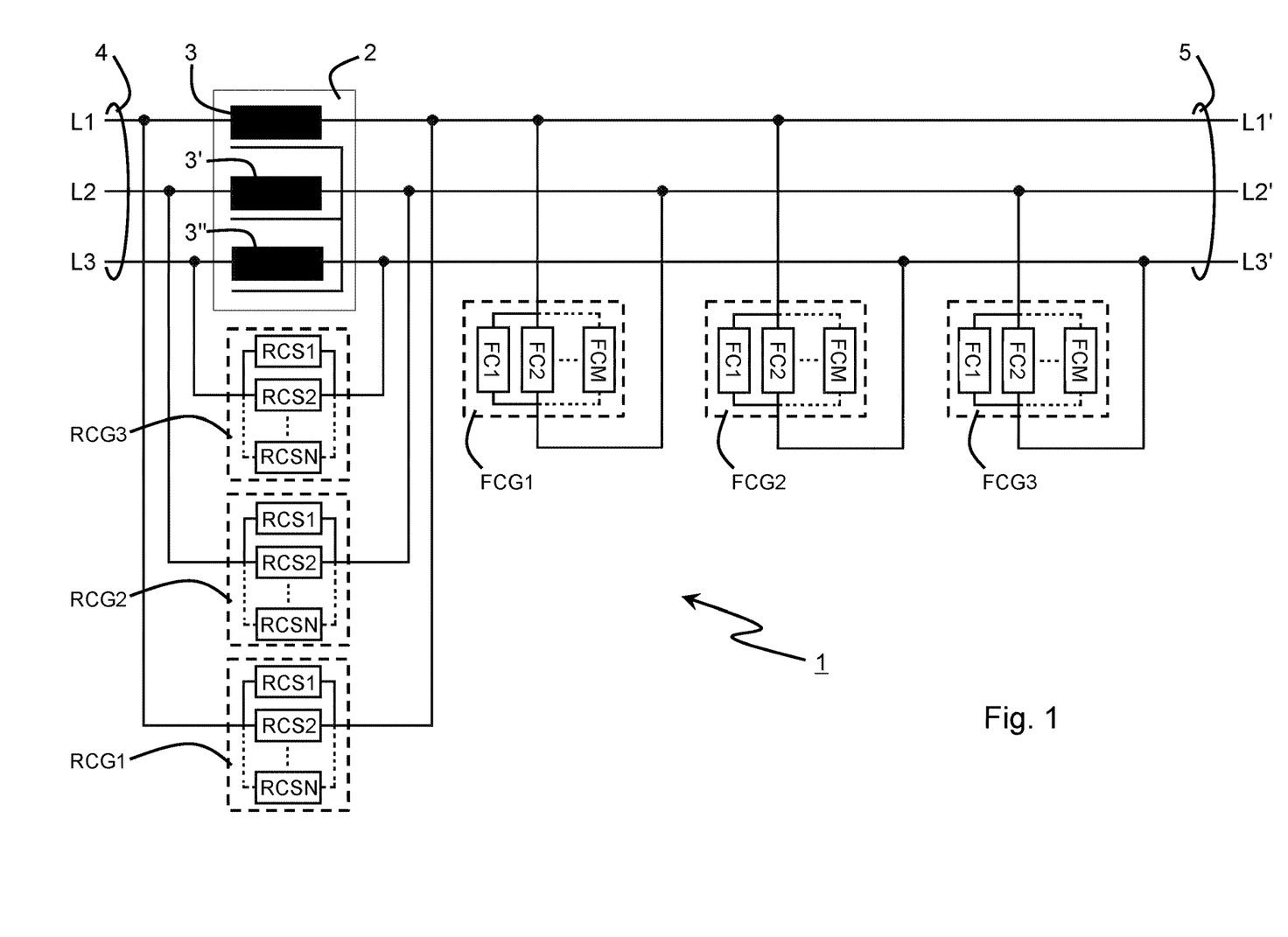
FIG. 1 shows a schematic circuit diagram of an exemplary embodiment of a filter circuit element according to the disclosure having a line choke, three RCS circuit groups, and three filter circuit groups, according to an embodiment.

There are now various options for designing and refining the teaching of the disclosure in an advantageous manner. For this purpose, reference is made, on the one hand, to the claims dependent on the concurrent claims and, on the other hand, to the following explanation of exemplary embodiments of the disclosure on the basis of the drawing. Disclosed embodiments are described with reference to the drawing. In the figures FIG. 1 shows a schematic circuit diagram of an exemplary embodiment of a filter circuit element 1 according to the disclosure. The filter circuit element 1 includes a line choke 2, which in turn includes three coils 3, 3', 3". The coils 3, 3', 3" of the line choke 2 are mechanically coupled to one another, which is symbolized by the W-shaped line at the coils. The individual coils 3, 3', 3" of the choke 2 are each connected to one pole of an input 4 and one pole of an output 5. The input 4 or the filter circuit element 1 as a whole, respectively, is configured so that the phases of an energy supply system L1, L2, L3 can be connected to the corresponding poles of the input 4 and a three-phase AC voltage can be input into the filter circuit element 1. The filtered phases L1', L2', L3' are output at the poles of the output 5 and can be input into a consumer.

One RCS group RCG1, RCG2, RCG3 is connected in parallel to each of the individual coils of the choke 2, each group consisting of N RCS circuits RCS1, RCS2, . . . , RCSN (wherein N is a natural number). Filter circuit groups FCG1, FCG2, FCG3 are respectively connected between the individual phases L1, L2, L3, wherein each of the filter circuit groups FCG1, FCG2, FCG3 includes multiple filter circuits FC1, FC2, . . . , FCM (wherein M is a natural number, which can be equal or unequal to N). It is to be noted in this case that the RCS groups or the filter circuit groups do not necessarily have to have identical RCS circuits or filter circuits, respectively. However, if one presumes that all phases are loaded with identical resonant oscillations and harmonics, this has to be the case regularly in practical circuits.

The RCS groups RCG1, RCG2, RCG3 are each adjusted to dissipating resonant currents at the line choke 2 and the overvoltages thus induced. The filter circuit groups FCG1, FCG2, FCG3 are each configured to the harmonics feeding back into the output 5. Assume the input 4 of the filter circuit element 1 is connected to a rotary-phase current network having string voltages of 230 V and a network frequency of 50 Hz and the output 5 of the filter circuit element is connected to the inverter of an electronically commutative motor (EC motor), which has a power consumption of 6 kW. The inverter includes in this case a slender intermediate circuit, which is formed by a six-pulse bridge rectifier and a smoothing capacitor. The bridge rectifier generates a pulsing DC voltage, which is smoothed by the smoothing capacitor, from the three-phase voltage L1', L2', L3' from the filter circuit element 1, wherein ripples still remain on the DC voltage because of the formation as a slender intermediate circuit. This DC voltage is input into an inverter stage, which generates an AC voltage having variable frequency from the DC voltage. Harmonics result due to the rectifier, which are fed back into the filter circuit element 1. A resonant current, which induces resonant currents in the choke, arises due to the smoothing capacitor together with the line choke. In addition, the inverter generates high-frequency interference, the frequency of which is dependent on the frequency of the inverter and is usually at a few kilohertz.

The tuning of the filter circuit groups FCG1, FCG2, FCG3 will be discussed again in greater detail with reference to the groups. The harmonics generated by the rectifier are at multiples of the network frequency, wherein the number corresponds to the order of the number of the multiple. I.e., the harmonic of nth order has the frequency n*50 Hz, wherein n is a natural number. The harmonics of lower orders usually have higher amplitudes than the harmonics of higher order. Under the assumption that a filter circuit group FCG1, FCG2, FCG3 includes three filter circuits in each case, the first filter circuit FC1 can thus be configured to the fifth-order harmonics, the second filter circuit FC2 to the seventh-order harmonics, and the third filter circuit FC3 to the eleventh, thirteenth, and higher orders. The center frequency of the first filter circuit FC1 can be selected to be, for example, at 250 Hz, the center frequency of the second filter circuit FC2, for example, at 350 Hz, and the center frequency of the third filter circuit FC3, for example, at 550 Hz. In this manner, harmonics up to the fortieth order can be strongly reduced. A non-sinusoidal load current becomes approximately sinusoidal again.

Figure 2:
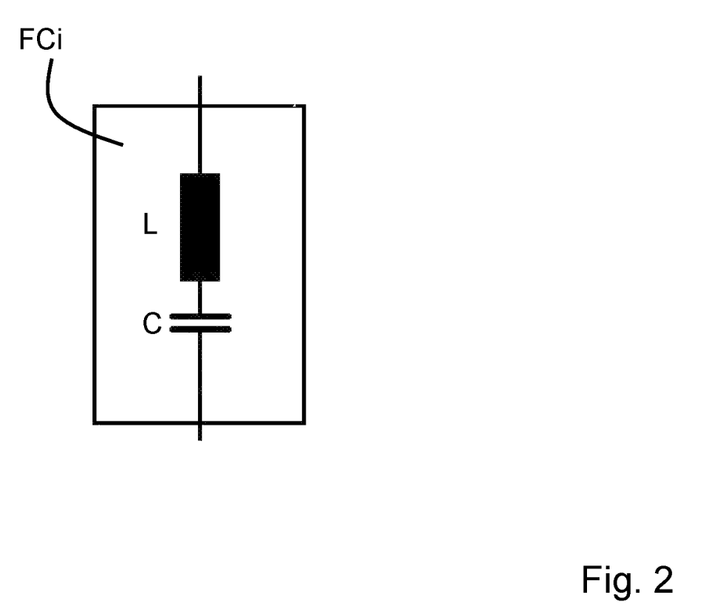
FIG. 2 shows an exemplary embodiment of a filter circuit having a coil and a capacitor, according to an embodiment.

FIG. 2 shows an exemplary embodiment of a filter circuit FCi, wherein i is a natural number between 1 and M. The filter circuit FCi consists in this case of a coil L and a capacitor C. In this case, the core L ensures a sufficiently high impedance. The framework conditions for the dimensioning of the core L and the capacitor C have been described above in detail. The most important criterion for the dimensioning will be the center frequency and the bandwidth, which are defined by the requirements for the adaptations. If an optimization of the cos φ is additionally required, further boundary conditions result for the maximum size of the capacitor. A person skilled in the art will be able to perform suitable dimensioning based on these boundary conditions.

Figure 3:
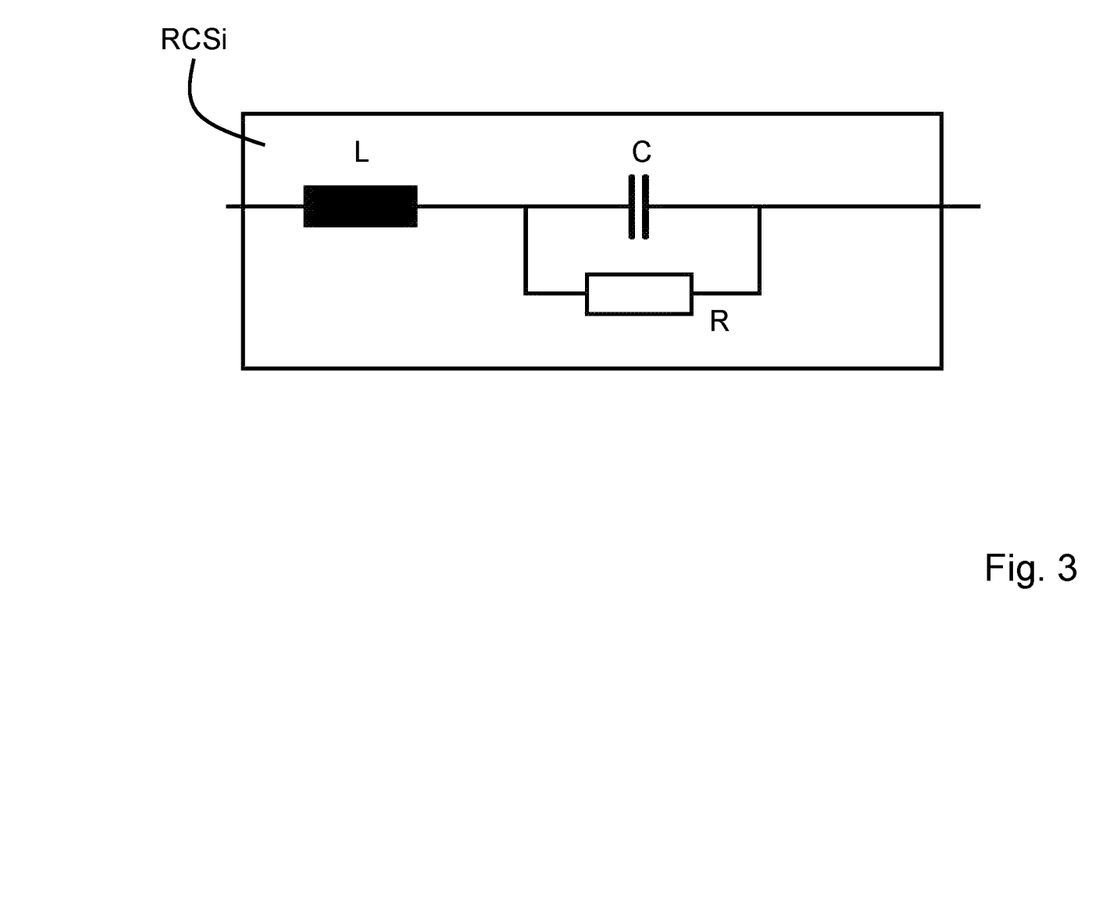
FIG. 3 shows an exemplary embodiment of an RCS circuit having a coil, a capacitor, and a resistor connected in parallel to the capacitor, according to an embodiment.

FIG. 3 shows an exemplary embodiment of an RCS circuit RCSi, wherein i is a natural number between 1 and N here. The RCS circuit RCSi consists in this case of a series circuit made of a coil L and a capacitor C. A resistor R is connected in parallel to the capacitor C. A person skilled in the art will also be able to carry out suitable dimensioning of the components here based on the boundary conditions described in the general part of the description.

Figure 4:
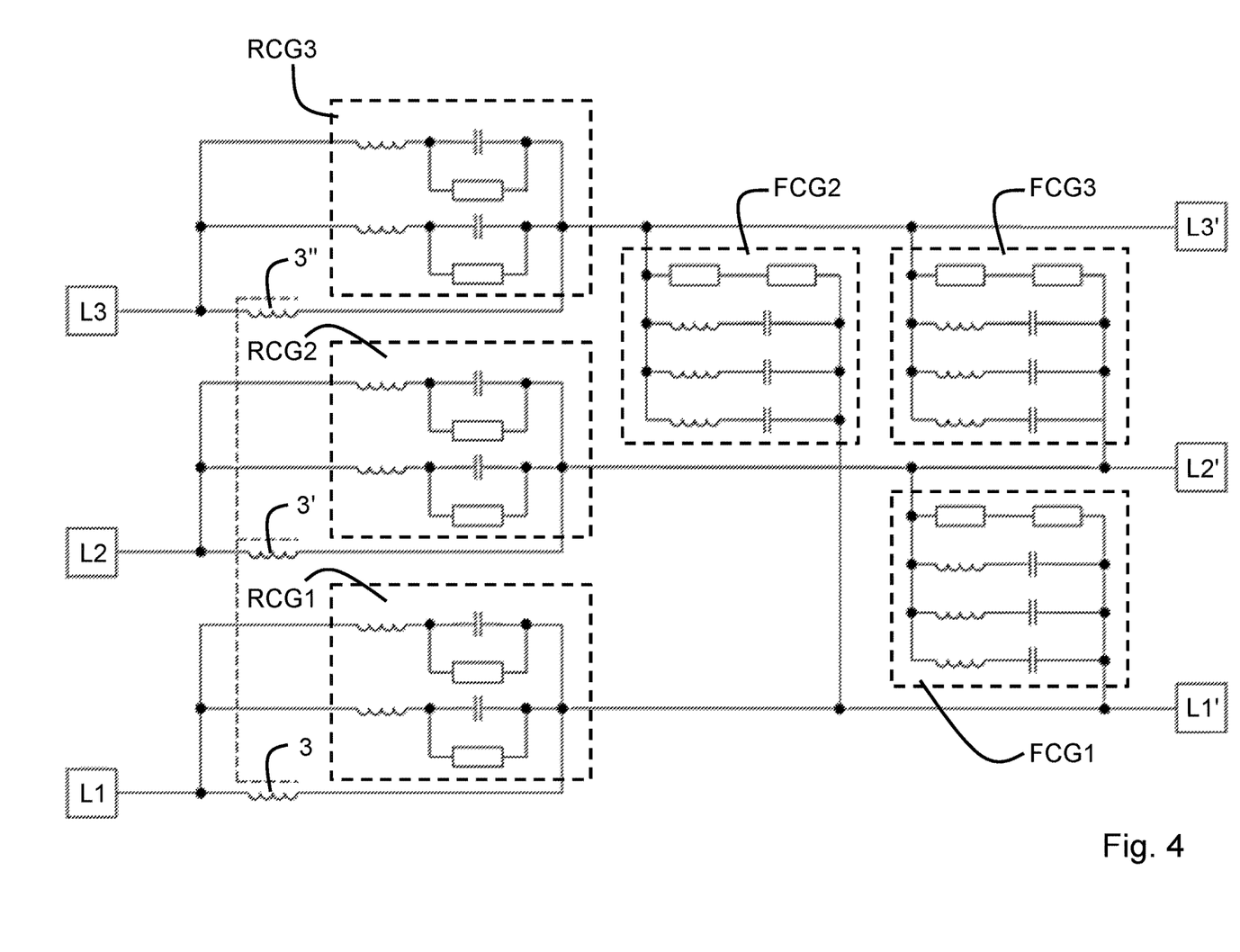
FIG. 4 shows a circuit diagram of a second exemplary embodiment of a filter circuit element according to the disclosure, according to an embodiment.

FIG. 4 shows an exemplary embodiment of a filter circuit element according to FIG. 1 having the designs of the filter circuit and the RCS circuit respectively illustrated in FIGS. 2 and 3. In this case, three RCS groups each having two RCS circuits and three filter circuit groups each having three filter circuits are used. In addition, two resistors R are provided in each filter circuit group, which are dimensioned in the megaohm range and are each, for example, 1 MΩ in size. These resistors discharge the filter circuits when the filter circuit element is disconnected from the energy supply.

Figure 5:
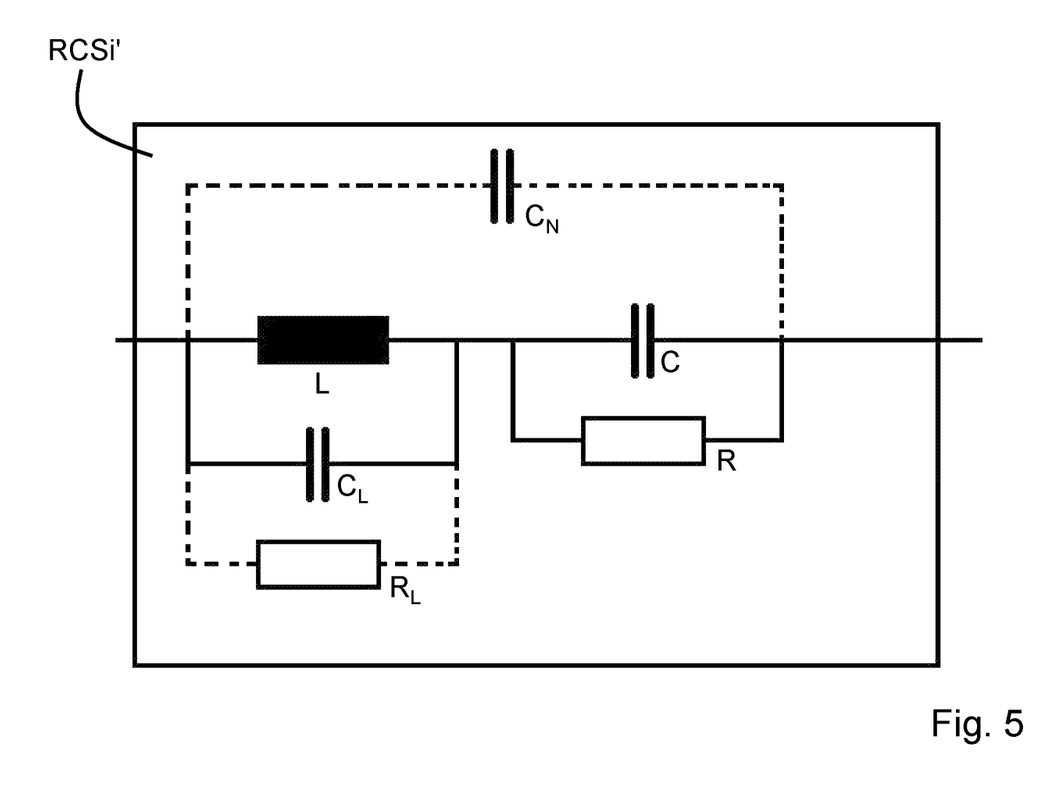
FIG. 5 shows a further exemplary embodiment of an RCS circuit having a coil, up to three capacitors, and up to two resistors, according to an embodiment.

FIG. 5 shows a further exemplary embodiment of an RCS circuit RCSi', wherein i is a natural number between 1 and N. This design of the RCS circuit has proven to be advantageous, for example, in the case of larger filters and can still further improve the THDi filtering. The RCS circuit RCSi' includes a series circuit of a first filter element and a second filter element. The first filter element includes a parallel circuit of a coil L, a capacitor $C_L$, and an optional resistor $R_L$. Capacitor $C_L$ can expand the effect of the RCS circuit to a larger frequency range in this case. Since resistor $R_L$ is optional, its connections are shown as dashed lines. The second filter element includes a parallel circuit of a capacitor C and a resistor R. In addition, the RCS circuit RCSi' can include a capacitor $C_N$, which is connected in parallel to the series circuit of first and second filter element. Since capacitor $C_N$ is optional, its connections are also shown as dashed lines. Resistor $R_L$ and capacitor $C_N$ can still further improve the damping of overvoltages. A person skilled in the art will also be able to carry out suitable dimensioning of the components here based on the boundary conditions described in the general part of the description.

Reference is made to the general part of the description and to the appended claims with respect to further advantageous designs of the filter circuit element according to the disclosure to avoid repetitions.

Finally, it is to be expressly noted that the above-described exemplary embodiments are used only to explain the claimed teaching, but do not restrict it to the exemplary embodiments.

LIST OF REFERENCE SIGNS 1 filter circuit element
2 line choke
3, 3', 3" coils (of the line choke)
4 input
5 output
L1, L2, L3 phases of the energy supply
L1', L2', L3' filtered phases at the output
RCG1, RCG2, resonant current suppression group
RCG3 (RCS group)
RCS1, RCS2, resonant current suppression circuit
RCSN (RCS circuit)
FCG1, FCG2, filter circuit group
FCG3
FC1, FC2, FCM filter circuit

What is claimed is:

1. A system configured to reduce feedback of a consumer on an energy supply, the system comprising:
a filter circuit comprising:
a multipolar input;
a line choke; and
a multipolar output,
wherein the input is configured to receive an AC voltage from the energy supply,
wherein the output is configured to provide energy to the consumer,
wherein the line choke includes one coil for each pole of the input,
wherein the coils of the line choke are each connected between a first pole of the input and a second pole of the output such that energy is transferred from the input to the output and/or vice versa;
a resonant current suppression group (RCS) connected in parallel with a coil of the line choke,
wherein the RCS group includes at least one RCS circuit including a coil and a capacitor, the RCS circuit having a bandpass characteristic,
wherein the bandpass characteristic is configured in each case to transmit resonant currents arising at the line choke such that voltage increases generated by the resonant currents are reduced or suppressed by the at least one RCS circuit, and
at least one filter circuit group (FCG), the FCG connected to two poles of the output, wherein the at least one FCG includes at least one FCG filter circuit (FCG FC).

2. The system of claim 1, wherein each coil of the line choke is connected in parallel with an RCS group having at least one RCS circuit.

3. The system of claim 1, wherein the at least one RCS circuit includes the coil and the capacitor connected in series.

4. The system of claim 3, further comprising a resistor connected in parallel with the capacitor.

5. The system of claim 1, wherein the RCS group includes multiple RCS circuits, the multiple RCS circuits connected in parallel,
wherein the bandpass characteristics of the multiple RCS circuits each have different center frequencies and/or different bandwidths.

6. The system of claim 1, wherein the at least one FCG FC has a bandpass characteristic,
wherein a center frequency and a bandwidth of the bandpass characteristic are configured to dissipate harmonics feeding back into the output.

7. The system of claim 1, wherein the at least one FCG FC includes a series circuit having a coil and a capacitor, wherein the capacitor has a capacitance of less than 30 μF, of less than 15 or of less than 10 μF.

8. The system of claim 1, further comprising an FCG having multiple FCG filter circuits, each of the multiple FCG filter circuits connected in parallel, wherein a bandpass characteristics of these multiple filter circuits each have different center frequencies and/or different bandwidths.

9. The system of claim 1, wherein the FCG includes a resistor which is connected in parallel to the at least one FCG FC.

10. The system of claim 1, wherein the coils of the line choke are magnetically coupled to one another.

11. The system of claim 1, wherein the input and the output each have two or three poles and are configured to be connected with one phase and a neutral conductor, with two phases, or with three phases.

12. The system of claim 1, further comprising:
a consumer circuit connected to the filter circuit, the consumer circuit configured to supply energy to the consumer,
wherein the consumer circuit is connected to the output of the filter circuit, and
wherein the consumer circuit is configured to receive energy from the energy supply connected to the input of the filter circuit such that energy is delivered from the energy supply to the consumer circuit.

13. The system of claim 12, wherein the consumer circuit includes a rectifier and/or other circuit elements configured to generate harmonics.

14. The system of claim 12, wherein the consumer circuit includes an inverter.

15. The system of claim 14, wherein the inverter includes a slender intermediate circuit and/or is configured to supply energy to an electric motor.

16. A system configured to reduce feedback of a consumer on an energy supply, the system comprising:
a filter circuit comprising:
a multipolar input;
a line choke; and
a multipolar output,
wherein the input is configured to receive an AC voltage from the energy supply,
wherein the output is configured to provide energy to the consumer,
wherein the line choke includes one coil for each pole of the input,
wherein the coils of the line choke are each connected between a first pole of the input and a second pole of the output such that energy is transferred from the input to the output and/or vice versa;
a resonant current suppression group (RCS) connected in parallel with a coil of the line choke,
wherein the RCS group includes multiple RCS circuits connected in parallel, each RCS circuit including a coil and a capacitor and having a bandpass characteristic, and
wherein the bandpass characteristic is configured in each case to transmit resonant currents arising at the line choke such that voltage increases generated by the resonant currents are reduced or suppressed by the RCS circuit, wherein the bandpass characteristics of the multiple RCS circuits each have different center frequencies and/or different bandwidths.

17. A system configured to reduce feedback of a consumer on an energy supply, the system comprising:
a filter circuit comprising:
a multipolar input;
a line choke; and
a multipolar output,
wherein the input is configured to receive an AC voltage from the energy supply,
wherein the output is configured to provide energy to the consumer,
wherein the line choke includes one coil for each pole of the input,
wherein the coils of the line choke are each connected between a first pole of the input and a second pole of the output such that energy is transferred from the input to the output and/or vice versa;
a resonant current suppression group (RCS) connected in parallel with a coil of the line choke,
wherein the RCS group includes at least one RCS circuit including a coil and a capacitor connected in series and having a resistor connected in parallel with the capacitor, the RCS circuit having a bandpass characteristic, and
wherein the bandpass characteristic is configured in each case to transmit resonant currents arising at the line choke such that voltage increases generated by the resonant currents are reduced or suppressed by the at least one RCS circuit.

* * * * *